US012635229B1

(12) United States Patent
Nandakumar

(10) Patent No.: US 12,635,229 B1
(45) Date of Patent: May 19, 2026

(54) ZERO TEMPCO RESISTOR

(71) Applicant: Texas Instruments Incorporated, Dallas, TX (US)

(72) Inventor: Mahalingam Nandakumar, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 343 days.

(21) Appl. No.: 18/345,833

(22) Filed: Jun. 30, 2023

Related U.S. Application Data

(60) Provisional application No. 63/409,335, filed on Sep. 23, 2022.

(51) Int. Cl.
| | |
|---|---|
| *H10D 84/80* | (2025.01) |
| *H10D 84/01* | (2025.01) |
| *H10D 84/03* | (2025.01) |

(52) U.S. Cl.
CPC ......... *H10D 84/811* (2025.01); *H10D 84/013* (2025.01); *H10D 84/0149* (2025.01); *H10D 84/038* (2025.01)

(58) Field of Classification Search
CPC .............. H10D 84/811; H10D 84/013; H10D 84/0149; H10D 84/038
See application file for complete search history.

(56) References Cited

U.S. PATENT DOCUMENTS

| | | | |
|---|---|---|---|
| 9,991,120 B2 | 6/2018 | Montgomery | |
| 2013/0200466 A1* | 8/2013 | Zhao .................... | H10D 84/811 257/E27.06 |
| 2016/0247875 A1* | 8/2016 | Aggarwal ............ | H10D 84/038 |

* cited by examiner

*Primary Examiner* — Fernando L Toledo
*Assistant Examiner* — Adam S Bowen
(74) *Attorney, Agent, or Firm* — Andrew R. Ralston; Frank D. Cimino

(57) ABSTRACT

A method of forming an integrated circuit by forming, from a semiconductor layer, a resistor body and an active device feature, in which same process steps are applied to both structures using non-dopant co-implants.

19 Claims, 16 Drawing Sheets

NSD IMPLANT OR PSD IMPLANT, WITH OR WITHOUT CO-IMPLANT

ZERO TEMPCO RESISTOR

CROSS-REFERENCE TO RELATED APPLICATION

This application claims the benefit of and priority to U.S. Provisional Application No. 63/409,335, filed Sep. 23, 2022, which is incorporated herein by reference.

This application is related to U.S. patent application Ser. No. 18/345,873, filed contemporaneously herewith.

BACKGROUND

Zero temperature-coefficient of resistance (ZTCR, or zero tempco) resistors are an important component of some integrated circuits. Such resistors may provide a relatively stable performance of some circuits over a wide range of operating temperature. Some manufacturing processes, or flows, require extra processing steps to produce low or zero tempco resistance characteristics. Such extra steps are undesirable in low-cost devices, for which seemingly minor additional processing may result in significant aggregate manufacturing costs of such devices.

SUMMARY

In an example, there is a method of forming an integrated circuit. The method comprises, from a semiconductor layer having a first surface, forming a resistor body having a resistor surface as a portion of the first surface and an active device feature having an active device feature surface as a portion of the first surface; concurrently implanting a dopant into the resistor surface and the active device feature surface; concurrently co-implanting a non-dopant into the resistor surface and the active device feature surface; siliciding a portion of the resistor surface; and siliciding an entirety of the active device feature surface.

Other aspects are also described and claimed.

DETAILED DESCRIPTION

Figure 1:
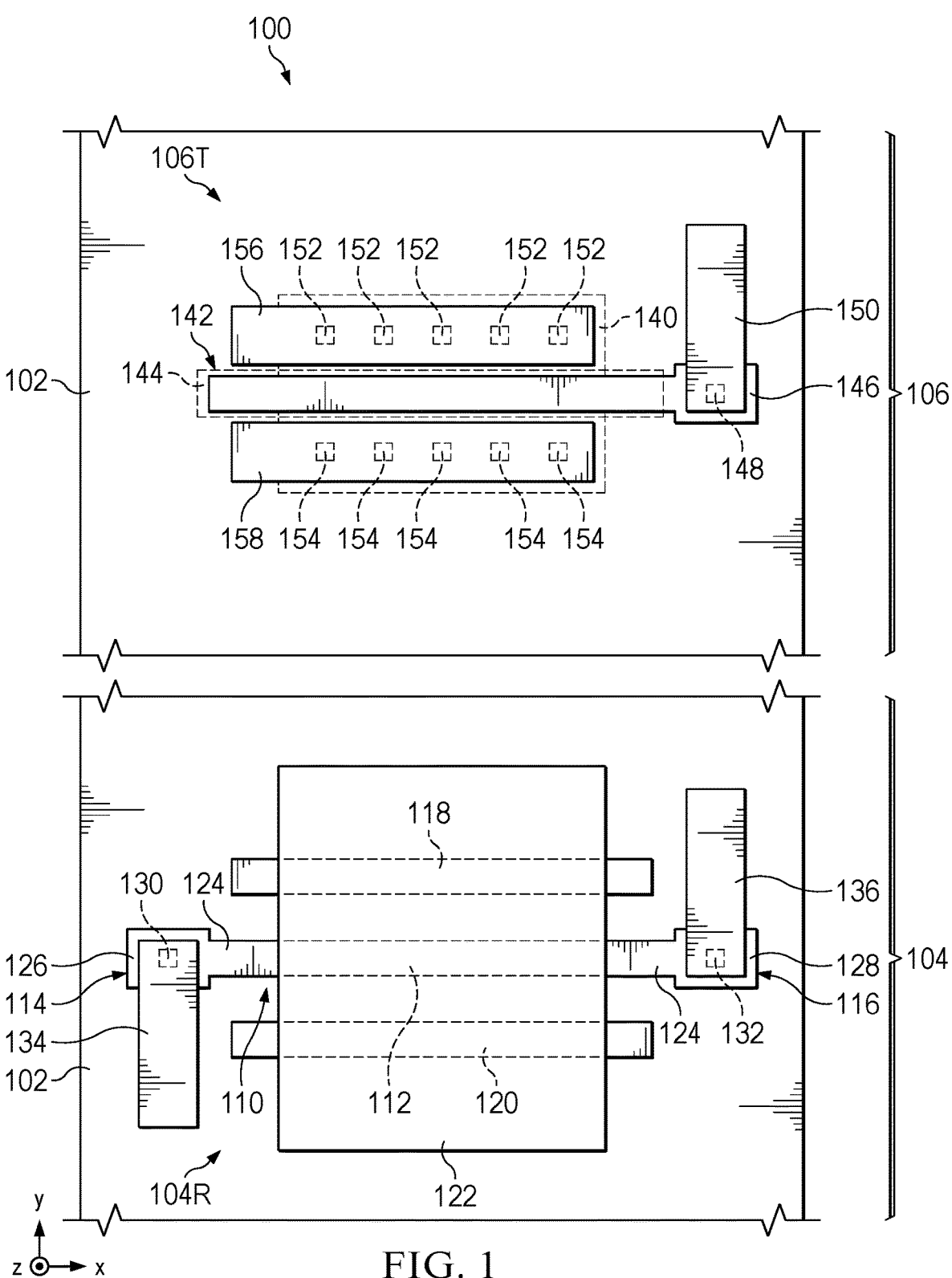
FIG. 1 is a plan and partial view of a semiconductor device, as part of an example including a resistor 104R and transistor 106T.

Examples are described with reference to the attached figures. The figures are provided to illustrate the examples and may not be drawn to scale. Several aspects are described with reference to example applications for illustration, in which like features correspond to like reference numbers. In FIG. 1 and various later figures, two or more dimensions shown and indicated in an x-y-z coordinate space, where in FIG. 1 a plan view is shown in the x-y plane but should be understood to also have features in the z-dimension, understood to be extending in a direction out of the plane of the image. The directional references are for purposes of relative placement, but such terms are not intended to be restrictive as the device may be rotated in space and thereby change absolute, but not relative, references. Numerous specific details, relationships, and methods are set forth to provide an understanding, but the scope is not necessarily limited by the illustrated ordering of acts or events, as some acts may occur in different orders and/or concurrently with other acts or events. Further, not all illustrated acts or events may be required to implement a methodology in accordance with one or more examples.

The examples relate to semiconductor integrated circuit (IC) fabrication, and more particularly but not exclusively to an IC that includes "zero temperature-coefficient of resistance" (ZTCR) resistors, which are also sometimes referred to as having zero tempco, meaning little or no variability in resistance over a certain temperature range.

IC fabrication of plural devices on a same substrate, such as resistors and transistors, typically involves multiple steps, but sometimes it is undesirable to include one or more steps that are limited to only one or the other device, thereby increasing the total number of required fabrication steps. Such an approach can be particularly undesirable in low cost device/process flows. For example, in a low cost flow, there may be a preference to not use a separate mask, and its related steps of patterning, implanting (e.g., with boron), and mask removal, for zero tempco resistors. Accordingly, an effort may be made to use a same step or steps to apply to concurrent formation of both zero tempco resistor and other device (e.g., transistor) features. However, considerations for transistor feature formation may differ from the zero tempco resistor, so a process step more favorable to the transistor feature may be less favorable to the zero tempco resistor, or vice-versa. In contrast, where a separate step or steps are required to achieve the zero tempco resistor, the overall manufacturing cost is increased, as opposed to a step that concurrently forms a portion of both devices.

While the preceding may apply to various baseline devices, this document provides examples that may improve on certain of the above concepts, as detailed below. While such examples may be expected to provide various advantages as described above, no particular result is a requirement unless explicitly recited in a particular claim.

FIG. 1 is a plan and partial view of a semiconductor device 100, e.g. a portion of an IC. The semiconductor device 100 includes a semiconductor substrate 102, for example as part of a silicon wafer. Such a wafer typically includes multiple locations, each corresponding to a same or different IC on the wafer, so the illustration of FIG. 1 (and later figures) can be repeated in each wafer IC location. The wafer typically provides either a p-type or n-type semiconductor, and the semiconductor substrate 102 can represent a portion of the bulk wafer or a region (e.g., a well and/or buried layer and/or epitaxial layer) formed in connection with the wafer. As detailed in the remaining figures, a resistor area 104 and an active device area—shown by example as a transistor area 106—are provided, into which are ultimately formed examples of a respective resistor 104R and transistor 106T, in connection with the semiconductor substrate 102. The resistor 104R and transistor 106T are represented by certain general features and corresponding areas in FIG. 1, with additional details, options, and attributes described later. Ultimately, the figures and corresponding descriptions provide resistor and transistor examples that may provide one or more benefits, such as efficiency, cost-savings, and/or performance, for example including favorable low TCR in the resistor 104R, while forming the resistor 104R (or different resistor examples) utilizing process steps that may occur concurrently with forming the transistor 106T (or other active device(s) or feature(s)), and without requiring a separate ZTCR mask and implant for solely the resistor 104R. Nevertheless, the example resistor 104R achieves ZTCR performance along with options for different sizes and dopant types and locations, while implementing the transistor 106T without diminishing its dopant activation or performance.

The resistor 104R includes a polysilicon structure 110 (e.g., of polysilicon or polysilicon germanium) with a major axis in the x-dimension, along which the polysilicon structure 110 may have a length, for example, in a range from 0.2 μm to 100 μm. The polysilicon structure 110 includes a polysilicon resistor body 112 and opposing first and second ends 114 and 116. The polysilicon resistor body 112 may have a length from 0.2 μm to 100 μm and a width (in the y-dimension) in a range from 0.03 μm to 50 μm. Each of the ends 114 and 116 has a length (in the x-dimension) that may range from 0.03 μm to 0.25 μm and a width (in the y-dimension) that may range from 0.03 μm to 50 μm. Note in certain of the figures that the width of ends 114 and 116 is shown as greater than the width of the polysilicon resistor body 112, where the greater end width may be implemented to accommodate the size of contacts 130 and 132, described below. Also for example, in the same steps that form the polysilicon structure 110, also formed from a same polysilicon layer, for example by appropriate masking and etching, are one or more dummy polysilicon features 118 and 120, for example parallel to, and equally opposed and spaced from, respective sidewalls of the polysilicon resistor body 112. Each of the dummy polysilicon features 118 and 120 may have a same width, which may be slightly smaller than that of the polysilicon resistor body 112. The dummy polysilicon features 118 and 120 are not functional as part of the resistance achieved through the resistor 104R per se, but may be implemented as part of good or best practices as width control for the polysilicon resistor body 112, for example in influencing a plasma etch of the polysilicon material that results in the polysilicon resistor body 112.

The polysilicon resistor body 112 and its ends 114 and 116 generally provide the resistance of the resistor 104R, and that resistance is accessible by various conductive structures. For example, a silicide block (SiBLK) 122 is formed over a majority of the exposed x/y plane area of the polysilicon resistor body 112 (and likewise of the dummy polysilicon features 118 and 120). After the SiBLK 122 is formed, various silicide regions are formed, for example by siliciding exposed (not blocked by the SiBLK 122) polysilicon, thereby resulting in a body silicide 124 over exposed portions of the polysilicon resistor body 112, and first and second end silicides 126 and 128 over the first and second ends 114 and 116, respectively. Accordingly, in the x-y plane, the resistor 104R has an upper surface that is only partially silicided, for example, with silicide covering a range of 0.2 to 70 percent of the x/y plane area of the resistor 104R, with the remainder unsilicided, between the first and second ends 114 and 116. After the silicides are formed, conductive contacts 130 and 132 are formed. Each of the conductive contacts 130 and 132 extends, in the z-dimension, to a respective one of the first and second end silicides 126 and 128. The contacts 130 and 132 electrically conduct to, and also may be part of, respective metal layer portions 134 and 136, which may extend far greater in the y-dimension than as shown in FIG. 1. Accordingly, a resistance provided by the resistor 104R may be electrically accessed by coupling to each of the metal layer portions 134 and 136.

The transistor 106T includes a moat 140, shown by a dotted line to represent it is an intended area in which transistor source/drain regions are formed on opposing sides of a transistor gate 142, as further described below. The moat 140 may include one or more doped regions, typically all of a same conductivity type but potentially of different dopant concentrations. For example, the semiconductor substrate 102 may be of a first conductivity type (e.g., p-type), and the moat 140 may include a conductivity type (e.g., n-type) that is opposite of, or complementary to, the conductivity type of the semiconductor substrate 102. Other alternatives or variations are understood in the art (e.g., buried layers, epitaxial layers, wells, and the like). As detailed later, in some examples, a same dopant implant also may be introduced into both the moat 140 and portions, or all, of the resistor 104R polysilicon structure 110, concurrently with, or without, a non-dopant co-implant species (e.g., carbon, nitrogen). For purposes of this document, a non-dopant co-implant species is intended to mean an atomic species that does not ionize within a silicon substrate at room temperature (~22° C.). A non-dopant co-implant species may be isovalent with Si (e.g., carbon) or may have an energy level greater than 150 meV above the Si valence band or less than 150 meV below the Si conduction band (e.g., nitrogen). In the described examples, these co-implants are thought to pin the dopant profiles within the grains thereby improving resistor mismatch and substantially eliminating resistor drift under stress/temperature. Accordingly, in such examples a mutual doping and/or co-implant step may achieve favorable device attributes in the resistor 104R and the moat 140 of the transistor 106T.

The transistor gate 142 includes a polysilicon transistor gate 144 that is enclosed in a dotted perimeter in FIG. 1, as the polysilicon transistor gate 144 is not directly visible in the FIG. 1 perspective. Specifically, the FIG. 1 perspective illustrates that the polysilicon transistor gate 144 is covered by a gate silicide 146, formed above (in the z-dimension) the polysilicon transistor gate 144. In an example, the polysilicon transistor gate 144 is formed in the same polysilicon formation/masking, and etch step(s) as is the resistor 104R polysilicon structure 110. As detailed later, in some examples, a same dopant implant, with or without a non-dopant co-implant (e.g., carbon, nitrogen, a combination thereof), also may be introduced, for example concurrently, into both the gate polysilicon transistor gate 144 and the resistor 104R polysilicon structure 110. Accordingly, in such examples a mutual doping and/or co-implant step may achieve favorable device attributes in the resistor 104R and/or the transistor gate 142. Moreover, where a process flow for forming the transistor 106T already includes such a doping and/or co-implant step, that same step may be used to apply (partially or entirely) to the resistor 104R, without adding an additional step(s) into the process flow.

Various regions of the transistor 106T are accessible by various conductive structures. For example, at the same time the gate silicide 146 is formed, source/drain silicides may be formed within the perimeter of the moat 140, but are not visible in FIG. 1 as they are below other illustrated structures. Particularly, after the gate silicide 146 is formed, a conductive contact 148 is formed to extend in the z-dimension, for example to one end of the polysilicon transistor gate 144/gate silicide 146 that reaches beyond the x/y perimeter of the moat 140. The conductive contact 148 electrically conducts to, and also may be part of, a metal layer portion 150. Similarly, a first conductor set 152, including one or more conductive contacts, is formed on a first side of the gate conductor 144 and downward in the z-dimension to a first source/drain silicide, again not visible in FIG. 1. And, a second conductor set 154, including one or more conductive contacts, is formed on a second side, opposite the first side, of the gate conductor 144 and downward in the z-dimension to a second source/drain silicide, again not visible in FIG. 1. Accordingly, the first conductor set 152 may electrically communicate with a first source/drain region in the moat 140, and the second conductor set 154 may electrically communicate with a second source/drain region in the moat 140. Lastly, the first conductor set 152 conducts to, and also may be part of, a metal layer portion 156, and the second conductor set 154 conducts to, and also may be part of, a metal layer portion 158.

Figures 2, 3:
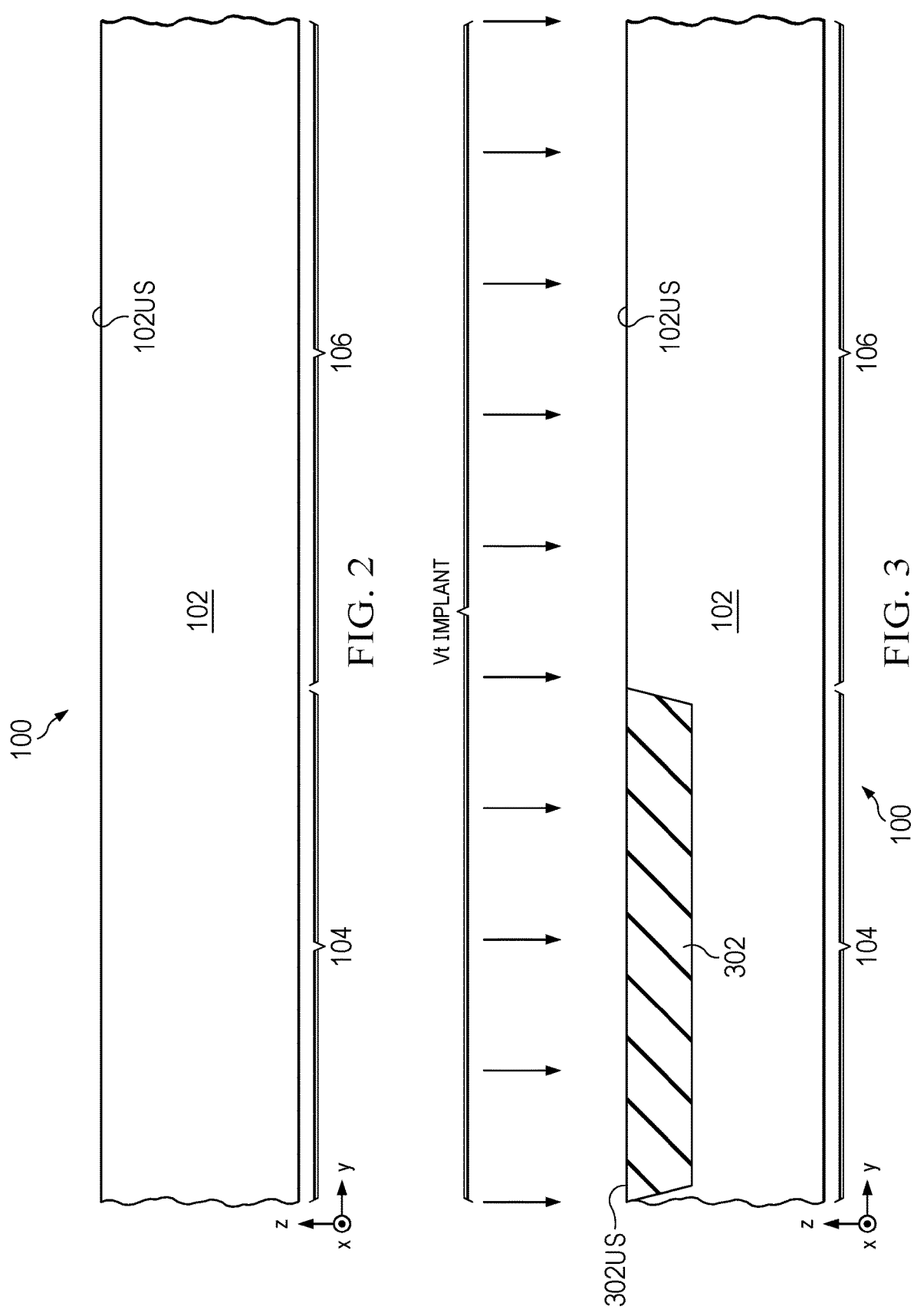
FIGS. 2 through 8 are cross-section views representing successive fabrication stages and resultant structures of the FIG. 1 semiconductor structure.

FIGS. 2 through 8 are cross-sectional views, for example in the +x-dimension (y-z. plane) across FIG. 1, representing successive fabrication stages and resultant structures of the FIG. 1 semiconductor device 100. In FIG. 2, the semiconductor device 100 is provided at an early manufacturing stage. The semiconductor device 100 includes the semiconductor substrate 102, for example as part of a silicon wafer. Such a wafer typically includes multiple locations, each corresponding to a same or different IC on the wafer, so the illustration of FIG. 2 (and later figures) can be repeated in each wafer IC location. The wafer typically provides either a p-type or n-type semiconductor, and the semiconductor substrate 102 can represent a portion of the bulk wafer or a region (e.g., a well, buried layer or epitaxial layer) formed in connection with the wafer. As introduced above, and detailed in the remaining figures, the semiconductor substrate 102 includes the resistor area 104 and the transistor area 106, into which are ultimately formed examples of the resistor 104R and the transistor 106T, respectively. Ultimately, these figures, and the corresponding descriptions, provide for any one or more of an efficient, cost-sensitive formation of each of the resistor 104R and the transistor 106T, for example including favorable low resistance in the resistor 104R, the absence of a separate ZTCR mask and implant, the availability of ZTCR performance in the resistor 104R (along with options for different sizes and dopant types), and implementing the transistor 106T without diminishing its dopant activation or performance.

In FIG. 3, a surface isolation structure 302, for example a shallow trench isolation (STI) structure, is formed in a portion of an upper surface 102US of the semiconductor substrate 102, corresponding to the resistor area 104. The surface isolation structure 302 is shown for example as an STI structure having a thickness in a range of 150 nm to 600 nm, and it may later conductively isolate the resistor 104R from the substrate 102. Alternative isolation methods also may be used, such as a different insulator, a local oxidation of silicon (LOCOS) structure, or a doped well region. Thereafter, a threshold voltage (Vt) implant is applied to the semiconductor substrate 102, with dopant type and energy selected to ultimately adjust the Vt of the transistor 106T, for example providing an average dopant concentration from $1e16/cm^3$ to $1e18/cm^3$. The Vt dopant may include, for n-type, boron or indium, and for p-type, phosphorous, arsenic, or antimony. Meanwhile, the surface isolation structure 302 essentially blocks the implant dopants in the substrate 102 from having an effect on the resistor in the resistor area 104.

Figures 4, 5:
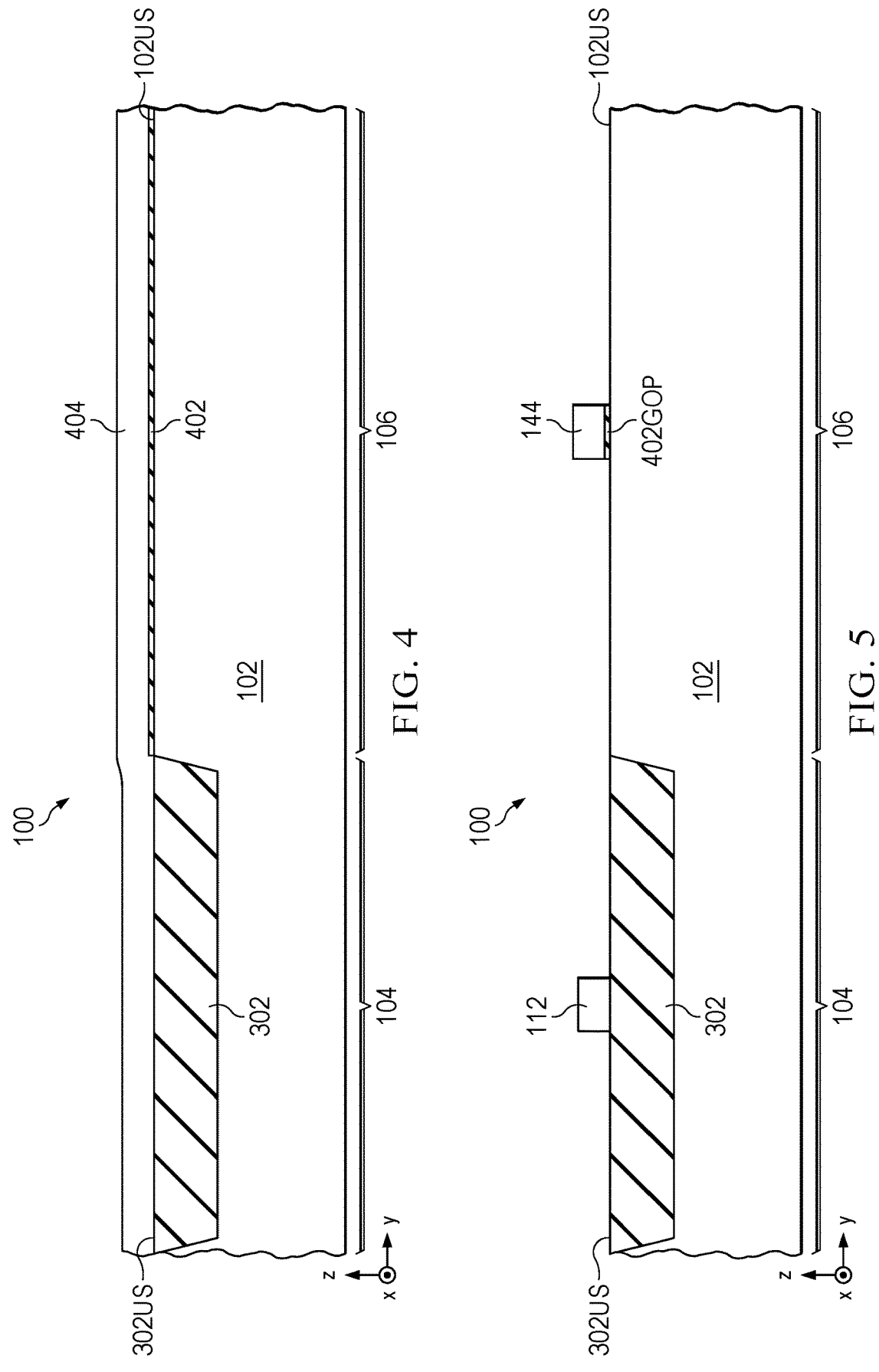

In FIG. 4, a gate oxide layer 402 is formed across a portion of the upper surface 102US, for example where the surface isolation structure 302 is not located and by oxidizing the remaining exposed portion of the upper surface 102US. The gate oxide layer 402 may have a thickness from 1 nm to 5 nm. Thereafter, a polysilicon layer 404 is deposited atop the entire illustrated structure, thereby conforming to the gate oxide layer 402 and an upper surface 302US of the surface isolation structure 302. The polysilicon layer 404 may be undoped when deposited, or may be in situ doped and/or doped by implant in some examples.

In FIG. 5, a mask (not shown) is formed and patterned over the FIG. 4 polysilicon layer 404, and the polysilicon layer 404 is correspondingly etched so that two portions of the polysilicon layer 404 remain, thereby providing the above-introduced polysilicon resistor body 112 and the polysilicon transistor gate 144. Further, the polysilicon etch is continued to the upper surfaces 102US and 302US, thereby removing exposed portions of the FIG. 4 gate oxide layer 402, while leaving the unexposed portion of the oxide layer 402 beneath the polysilicon gate 144, where that oxide portion is hereafter referred to as a gate oxide portion 402GOP.

Figure 6:
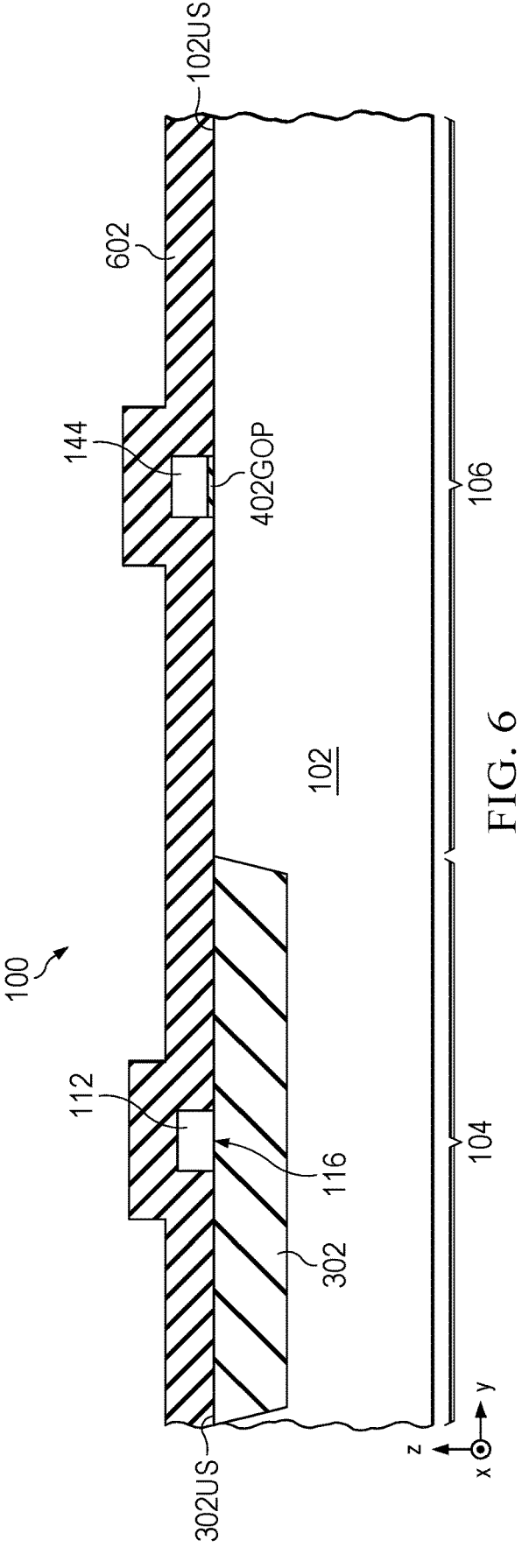

In FIG. 6, a layer 602 (or multiple separate layers) is formed over the FIG. 5 structure, in preparation to form alignment spacers in a later manufacturing stage. In the illustrated example, there is a single layer 602, but other examples are contemplated (for example, there are three such layers in co-assigned U.S. patent application Ser. No. 17/714,990, filed Apr. 6, 2022, entitled "Advanced Poly Resistor and CMOS Transistor", which is hereby fully incorporated herein by reference). The layer 602 may be formed from a dielectric material, such as oxide or nitride, or again from multiple layers, selected for examples from oxide or nitride. The layer 602 may have a total thickness from 10 nm to 120 nm, by ways of example.

Figure 7:
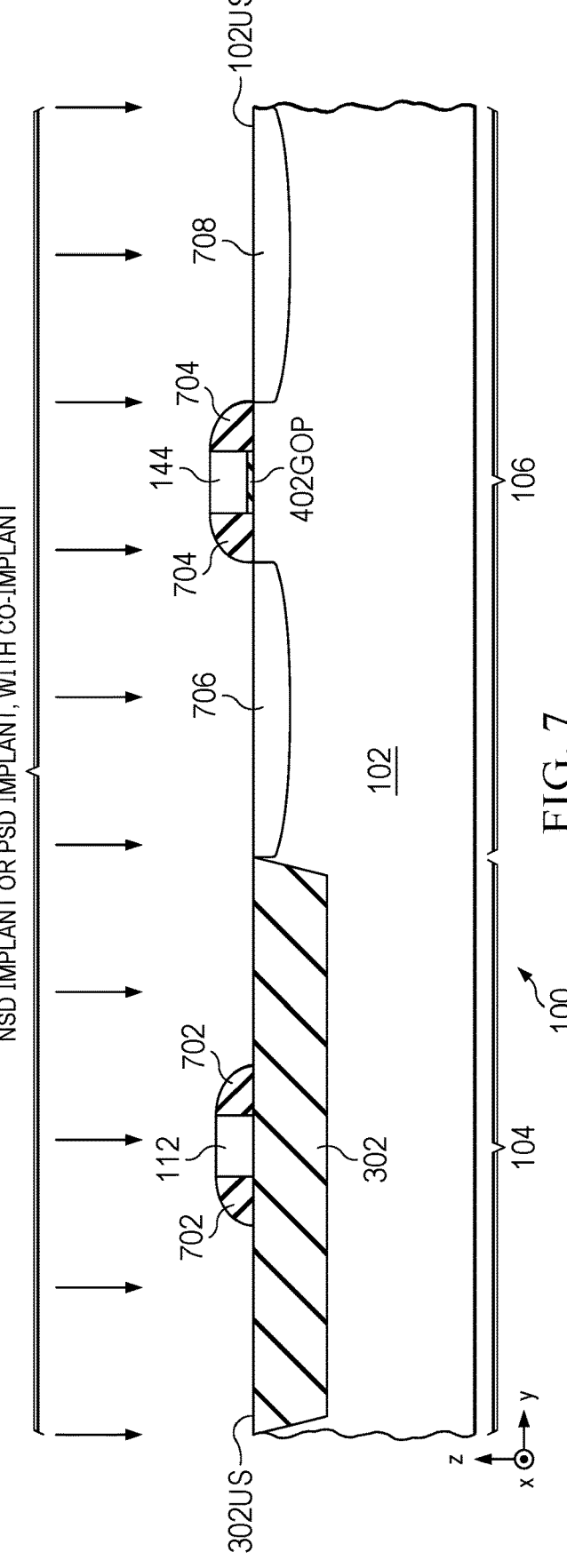

In FIG. 7, the FIG. 6 layer 602 is blanket etched down to the upper surfaces 102US and 302US, thereby forming a respective spacer 702 for the polysilicon resistor body 112 and a spacer 704 for the polysilicon transistor gate 144. Each of the spacers 702 and 704 includes a portion of the layer 602 (or a portion from one or more of its layers, if the layer 602 includes plural layers). After the spacer 704 is formed, a source/drain dopant implant is performed. In the transistor area 106, the source/drain implant forms corresponding first and second transistor source/drain regions 706 and 708 below the upper surface 102US, and that self-align to the spacer 704 (and, for the first source/drain region 706, also to the surface isolation structure 302). In the resistor area 104, the source/drain implant provides the selected dopant(s) into the polysilicon structure 110, including the illustrated polysilicon resistor body 112. The source/drain implant may be of n-type (referred to as NSD) or p-type (referred to as PSD), and is selected of a dopant type corresponding to the desired conductivity type of the transistor 106T. As an example for an NSD implant, a combination of arsenic and phosphorus dopants are used, with arsenic at an energy from 5 keV to 35 keV, and with a dose in a range of 5e14 to 5e15 atoms/cm², and with phosphorous at an energy from 1 keV to 10 keV, and with a dose in a range of 5e14 to 5e15 atoms/cm². As an example for a PSD implant, a boron dopant is used at an energy from 1 keV to 10 keV, and with a dose in a range of 5e14 to 1e16 atoms/cm², with the option of adding an indium pre-amorphizing implant (PAI), at an energy from 2 keV to 20 keV, and with a dose in a range of 5e13 to 5e14 atoms/cm². The implant also is at a relatively high concentration, for example yielding an initial average dopant concentration of 1e19/cm³ to 6e21/cm³ in the transistor gate 144 and the polysilicon resistor body 112. From FIG. 1, however, recall that the entirety of the transistor gate 144 is later silicided, whereas only portions of the resistor's polysilicon structure 110 are silicided (i.e., at the ends 114 and 116). Accordingly, later in the more-completed structure, and due in part from this implant, the dopant profiles as between the transistor gate 144 and the polysilicon resistor body 112 will differ, in that the dopants in each polysilicon structure will segregate preferentially due to the presence of adjacent silicide, as occurring from thermal and kinetic effects of silicidation. Thus, within the resistor 104R, its dopant profile will be non-uniform in the x-dimension (at a same z-value) along its polysilicon structure 110, due to the lack of silicide along its polysilicon resistor body 112 or the absence of silicide at its first and second ends 114 and 116 ends. Additionally, the implant, whether of n-type of p-type, also implants dopants into the polysilicon structure 110 (thus including its polysilicon resistor body 112), thereby affecting its conductivity, for example increasing the conductivity if the body were previously undoped polysilicon or in situ doped of the same dopant.

Also in connection with the FIG. 7 structure, a non-dopant co-implant is imparted into the semiconductor device 100. The non-dopant co-implant may precede, be overlapping, or concurrent with, the NSD or PSD implant, for example with respect to the same mask use for either the NSD or PSD implant. In an NSD example, a carbon co-implant is implanted at an energy from 2 keV to 20 keV, and with a dose in a range of 1e14 to 2e15 atoms/cm² and/or a nitrogen co-implant is implanted at an energy from 2 keV to 20 keV, and with a dose in a range of 2e14 to 2e15 atoms/cm². In a PSD example, a carbon co-implant may be used, for example combining it with a nitrogen co-implant, or without the combined nitrogen, and it is implanted at an energy from 2 keV to 20 keV, and with a dose in a range of 1e14 to 2e15 atoms/cm². In connection with the transistor 106T, the co-implant may be used to control dopant diffusion or channeling. In connection with the 104R, however, it has been observed in connection with present examples that the co-implants of appropriate dose/energy/combination may facilitate zero tempco performance. For example, for an n-type NSD, any of carbon, nitrogen, or germanium, or any group thereof, may be used as a co-implant(s). Additionally, the use of a co-implant may provide any one or more of reducing resistance mismatch, reducing resistance drift, and reducing potential negative effects from a subsequent anneal(s).

Figure 8:
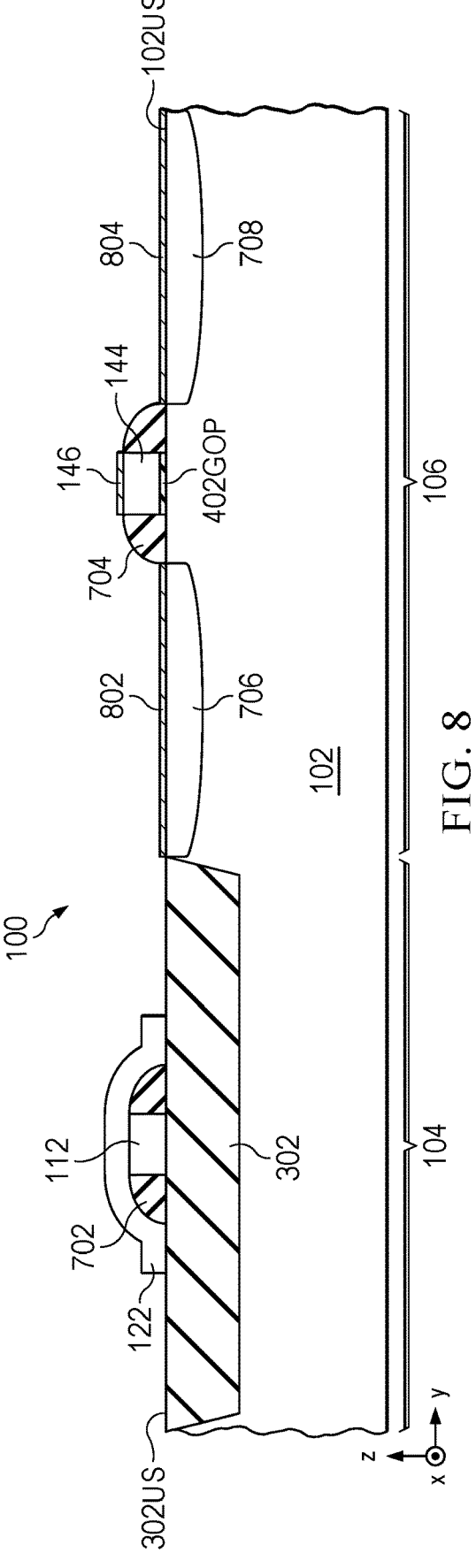

In FIG. 8, the SiBLK 122, introduced earlier in FIG. 1, is formed over portions of the polysilicon resistor body 112. In the perspective of FIG. 8, the SiBLK 122 is shown to cover the entire polysilicon resistor body 112 as the figure is cross-sectional at one line in the y-dimension, but note from FIG. 1 that the silicide blocking function of the SiBLK 122 is only in selective positions of the polysilicon resistor body 112, so with reference to FIG. 1, the SiBLK 122 is not in locations where subsequent silicides are to be formed, including the FIG. 1 body silicides 124 and 126. The SiBLK 122 may be preceded by other steps, for example in the forming of a capping layer and a stress memorization anneal(s), with additional details for the SiBLK 122 and such other steps provided in the above-incorporated U.S. patent application Ser. No. 17/714,990. Further, the SiBLK 122 generally may be formed at various different times, after polysilicon patterning and before silicidation (for example, accounting for spacer and/or anneal steps). Generally, the SiBLK 122 may be one or more layers, and it also may be grown or deposited, with a thickness, as examples, from 1 nm to 100 nm.

Continuing in FIG. 8, a silicidation step is performed, thereby forming silicides on exposed semiconductor structures. Particularly, the gate silicide 146, introduced in FIG. 1, is formed along an upper surface of the polysilicon transistor gate 144, while concurrently a first and second source/drain silicide 802 and 804 are formed along the first and second transistor source/drain regions 706 and 708, respectively. The first and second source/drain silicide 802 and 804 were introduced earlier in connection with FIG. 1, but are not expressly labeled therein as each is positioned below, in the z-dimension, the respective metal layer portions 156 and 158. Meanwhile, the SiBLK 122, in the dimension shown in FIG. 8, prevents silicidation of the polysilicon resistor body 112. However, any portion of the polysilicon resistor body 112 not covered by the SiBLK 122, as shown in FIG. 1 in the x-y plane beyond the outer boundary of the SiBLK 122, will receive silicide as part of the FIG. 8 silicidation, for example at the first and second ends 114 and 116. After FIG. 8, additional steps may be taken, and corresponding structure formed, as known or ascertainable in the art, with respect to resistor and transistor devices.

Figure 9:
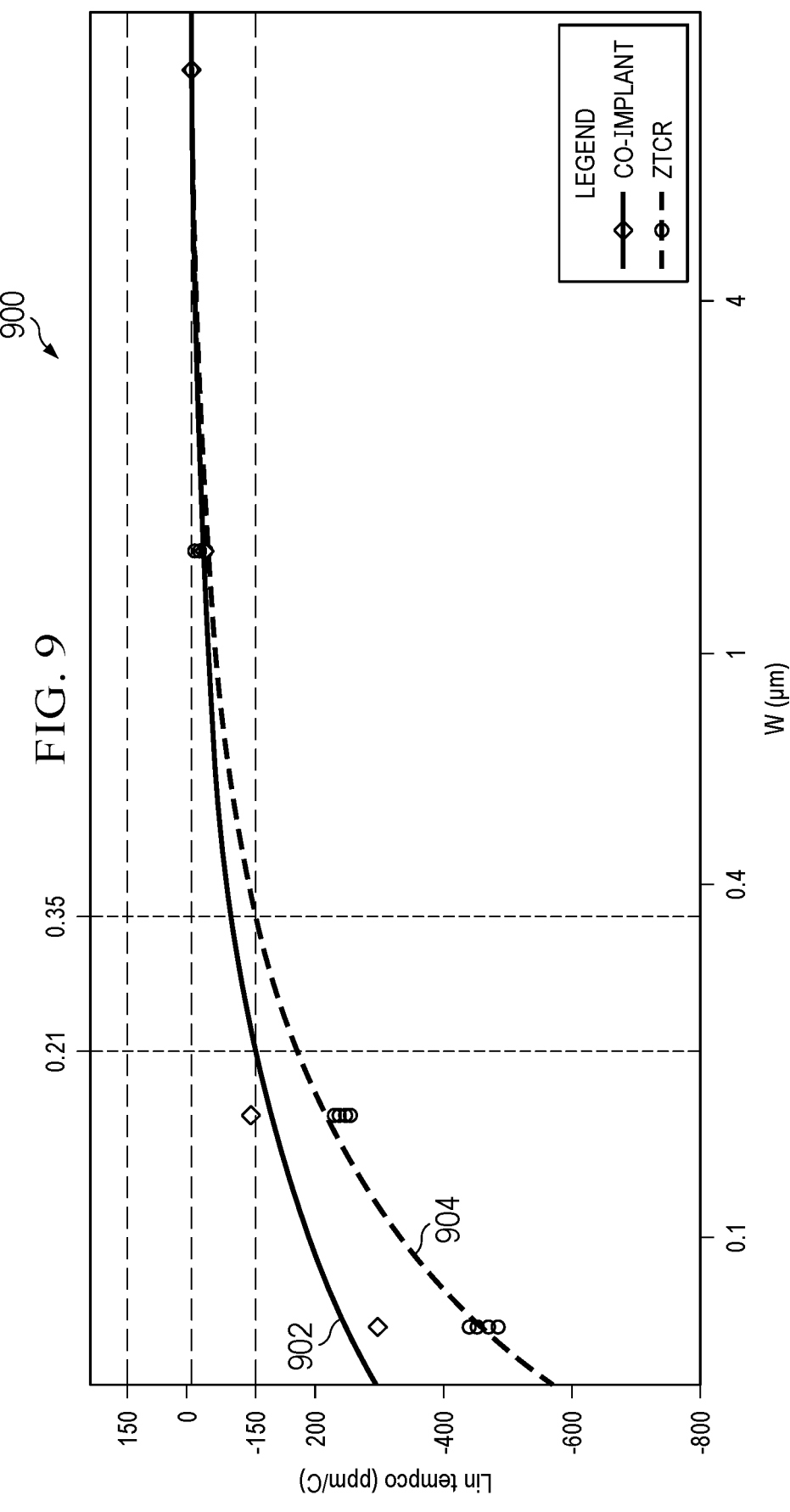
FIG. 9 is a resistance graph for two resistor types, one of which is consistent with FIGS. 1-8.

FIG. 9 is a resistance graph 900, for two resistor types, a first indicated in the legend as CO-IMPLANT consistent with FIGS. 1-8, as compared to a baseline (BL) ZTCR resistor formed according to some other method, which could include a baseline approach in which additional masks and dopant implants are directed to the resistor structure. The graph 900 includes examples of resistor size (e.g., resistor line width in the FIG. 1 y-dimension, for example in nanometers up to microns) on the horizontal axis and in logarithmic scale, and it includes example values of tempco, that is resistor temperature-variable resistance, on the vertical axis (e.g., parts per million (ppm) per ° C.). The graph 900 includes plots for the two-stated resistor types, namely, a CO-IMPLANT resistor resistance plot 902 and a BL ZTCR resistor resistance plot 904.

For both of the plots 902 and 904, the temperature-based performance of the corresponding resistor can be evaluated as each plot approaches, or is within some range of, zero ppm/° C. Particularly, as resistance is within some relatively small range of zero, the better the resistor may operate as a zero tempco resistor. Further, a resistor still may be usable for zero tempco (or near-zero tempco) performance if it falls within an application-appropriate tempco range. For example, consider the range of ±150 ppm/° C. as suitable as a zero tempco resistor. In this range, a BL ZTCR resistor having a width of at least approximately 0.35 μm has a −150 ppm/° C. tempco, but the tempco exceeds this limit for widths less than about 0.35 μm. In contrast, for a CO-IMPLANT resistor 104R constructed per the preceding, the tempco remains within the allowable limits down to a linewidth of approximately 0.2 μm, and it may do so with less complexity than the process(es) required to form the BL ZTCR. Accordingly, the preceding provides for zero tempco resistors spanning a greater range of widths. The co-implant allows for smaller size resistors with zero tempco thereby resulting in significant area reduction (in this case 40% area reduction). Additionally, the NSD dose of FIG. 7 may be adjusted for different polysilicon thicknesses to similarly satisfy zero tempco requirements (e.g., a range of ±150 ppm/° C.).

Figure 10:
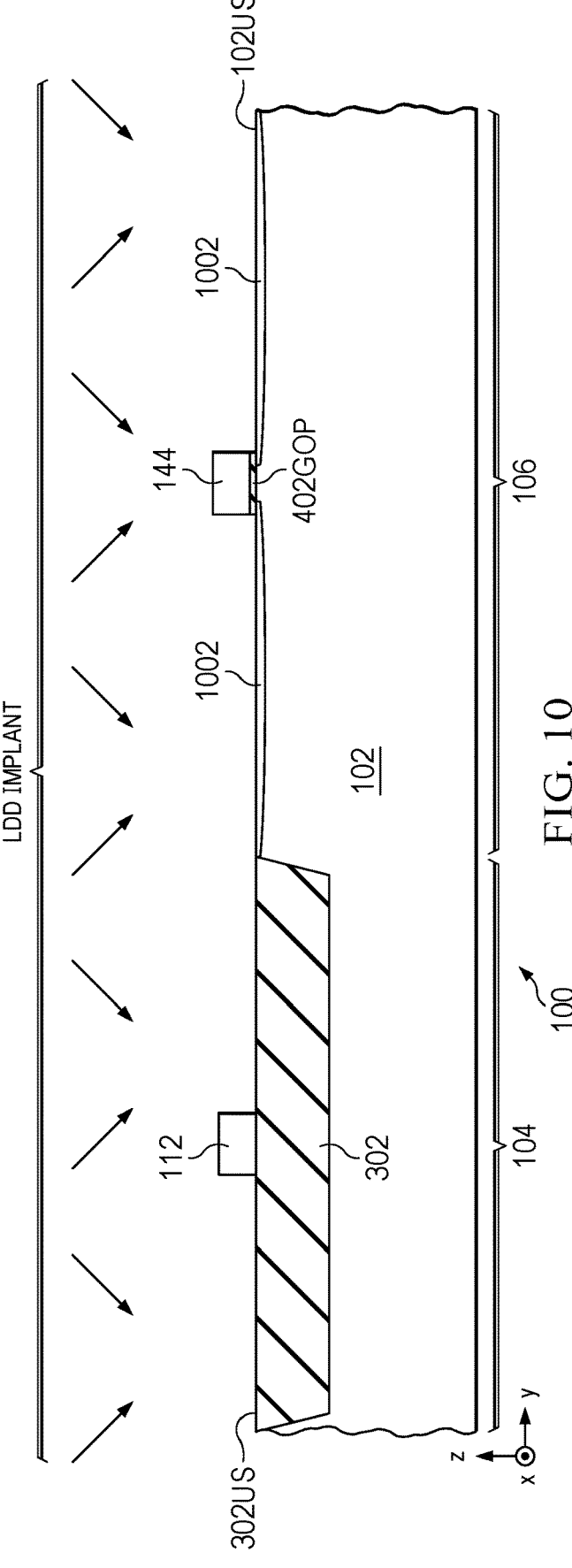
FIGS. 10 through 11 are cross-section views representing alternative successive fabrication stages and resultant structures of the FIG. 1 semiconductor structure.

FIG. 10 is a cross-sectional view, again in the same y-z plane as FIGS. 2 through 8, that represents a step that may be used to form alternative versions of the resistor 104R and transistor 106T. In FIG. 10, which for example may be performed before the FIG. 7 source/drain formation steps, a relatively light dopant implant, commonly referred to as a lightly doped drain (LDD) implant, is performed, forming corresponding LDD regions 1002 below the upper surface 102US and that self-align to the gate oxide portion 402GOP (and, at one end of the transistor 106T, also self-aligning to a lateral edge of the surface isolation structure 302). The LDD implant is typically provided at an energy lower than either an NSD or PSD implant, and it is selected of a dopant type corresponding to the desired conductivity type of the transistor 106T. For example, for an n-type metal oxide-semiconductor (NMOS) transistor, the LDD implant is of n-type dopants (e.g., arsenic, boron, and/or indium pocket implants, with an optional germanium PAI), for example with arsenic at an energy in a range from 1 keV to 2 keV and with a dose in a range of $2e14$ to $2e15$ atoms/$cm^2$, boron at an energy in a range from 3 keV to 12 keV and with a dose in a range of $1e13$ to $1e14$ atoms/$cm^2$ and with a 0 to 35 degree tilt with two or four rotations, and/or indium at an energy in a range from 10 keV to 45 keV with a dose in a range of $1e13$ to $1e14$ atoms/$cm^2$ and with a 0 to 35 degree tilt with two or four rotations. As an alternative example, for a p-type metal oxide-semiconductor (PMOS) transistor, the LDD implant is of p-type dopants (e.g., $BF_2$ (difluoroboron), boron, and/or indium or germanium PAI) for example with fluorine at an energy in a range from 1 keV to 5 keV and with a dose in a range of $1e14$ to $4e15$ atoms/$cm^2$, $BF_2$ at an energy in a range from 1 keV to 5 keV and with a dose in a range of $5e14$ to $5e15$ atoms/$cm^2$, boron at an energy in a range from 0.3 keV to 2 keV and with a dose in a range of $5e14$ to $5e15$ atoms/$cm^2$, and/or indium PAI at an energy in a range from 2 keV to 15 keV with a dose in a range of $1e13$ to $5e14$ atoms/$cm^2$ or a germanium PAI at an energy in a range from 5 keV to 20 keV with a dose in a range of $1e13$ to $5e14$ atoms/$cm^2$. The PMOS LDD also may include an arsenic/antimony pocket implant in a range from 20 keV to 60 keV with a dose in a range of $1e13$ to $1e14$ atoms/$cm^2$ or a phosphorous pocket implant in a range from 10 keV to 40 keV with a dose in a range of $1e13$ to $1e14$ atoms/$cm^2$ During the LDD implant, the polysilicon resistor body 112 (and entire polysilicon structure 110) may or may not be masked, based on a desired outcome for the resistor 104R. If the resistor body 112 (and polysilicon structure 110) is unmasked, ultimately the resistor 104R may have the same dopant type, as far as the majority of dopants is concerned, as the LDD implant, for example, if the LDD implant is n-type (sometimes referred to as NLDD), then the resistor 104R also may be n-type or, in complementary fashion, if the LDD implant is p-type (sometimes referred to as PLDD), then the resistor 104R also may be p-type.

Figure 11:
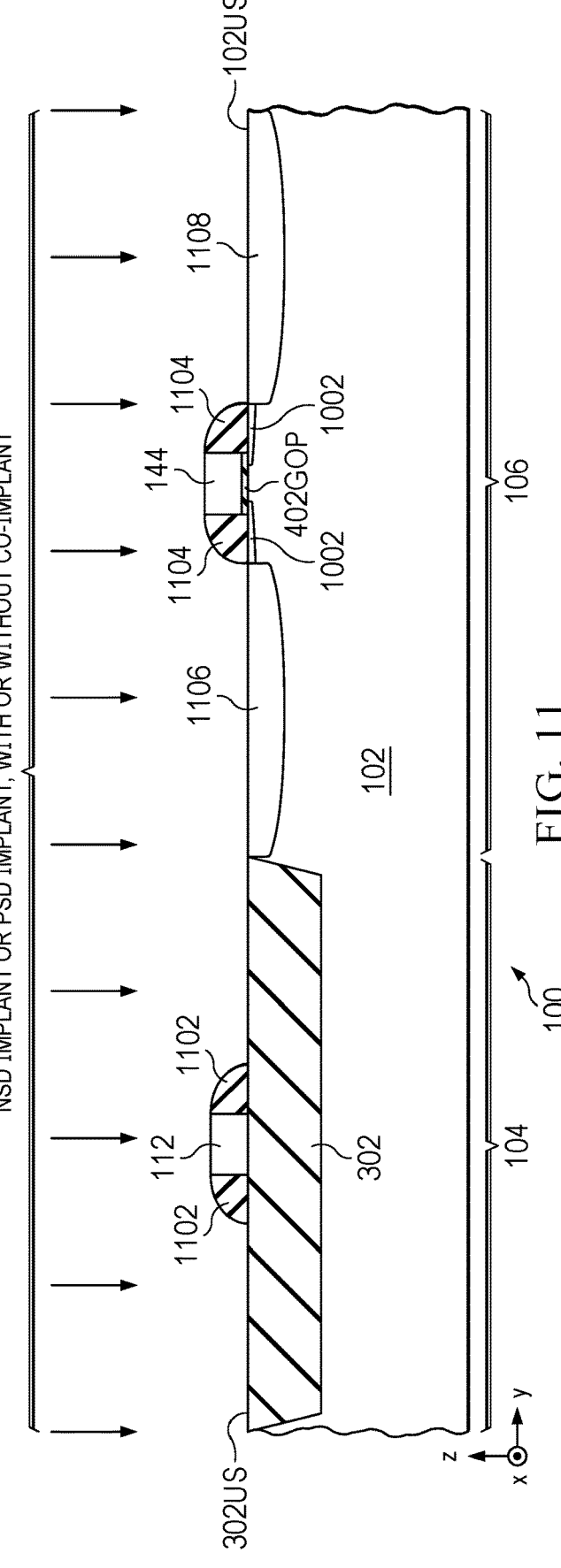

FIG. 11 is a cross-sectional view of FIG. 10, after and including additional processing steps. For example, FIG. 11 illustrates a dopant implant step, as may be achieved after the FIG. 10 LDD implant and following the formation of a respective spacer 1102 for the polysilicon resistor body 112 and a spacer 1104 for the polysilicon transistor gate 144, where the spacers 1102 and 1104 may be formed comparably to the steps of FIGS. 6-7. In a first example of FIG. 11, the implant may be comparable to FIG. 7, that is, either of n-type or p-type, and with (or preceded by) one or more co-implants at a concentration sufficient to create corresponding first and second transistor source/drain regions 1106 and 1108 below the upper surface 102US, and that self-align to the spacer 1104. The FIG. 11 implant type is of the same dopant type used for the FIG. 10 LDD implants, in which case the polysilicon structure 110 (and its resistor body 112) receives, previously from FIG. 10 an LDD implant of a first dopant type (either n-type of p-type) at a first dopant dose and first energy, followed later in FIG. 11 by a source/drain implant of the same first dopant type at a second dopant dose and second energy comparable to those described above for NSD and PSD implants with respect to FIG. 7, one or both of which are is greater than the first dopant dose and energy. Notably, therefore, the resistor body 112 receives two different doping steps of a same dopant type, which may be expected to create a lower resistance for the resistor 112R based on a net higher dopant concentration. However, in certain of the present examples, such an approach, with co-implants and at selective locations, has been found usable to achieve a desirably larger target resistance for the resistor 112R, while also achieving a low tempco (e.g., having an absolute value of 20 ppm/° C. or less), and also generally matching the variability and drift, of resistors which may be also formed in connection with the semiconductor substrate 102 and that include only an NSD (or PSD) implant. Particularly, co-implantation creation of zero tempco resistors may be used across an entire wafer, or in targeted or selected areas where particular factors, sometimes referred to as context dependencies, limit the application of other technologies for creating zero tempco resistors. For example, such context dependencies may occur due to positioning or orientation of the resistor 104R, or based on nearby structures, for example as may occur in relatively high polysilicon dense areas on the wafer, which can create complexities during annealing that might otherwise affect resistance, where such issues can be mitigated using the above-described co-implant methodology. In example structures, however, selected co-implantation with a combination of LDD and SD implants with co-implants selectively raises the local resistance to counteract context dependent effects—this is counterintuitive because addition of dopants generally lowers resistance, in this case it increases resistance and it can be used locally to counteract context dependence). Further, it is believed the unexpected result of a larger resistance may occur due to polysilicon grain size effect or effects at grain boundaries. Still further, because of laser anneal direction, the orientation of a resistor can affect its resistance. For example, a vertical orientation may have lower resistance. The combination of LDD and SD implants with co-implants can be used for the vertical orientation thereby minimizing the effects of orientation. As a result, in a single IC, one set of resistors may be formed with a combination of co-implants, and LDD and SD implants, while another set is formed without the LDD implant, with both sets having similar tempco and drift/mismatch characteristics.

Figure 12:
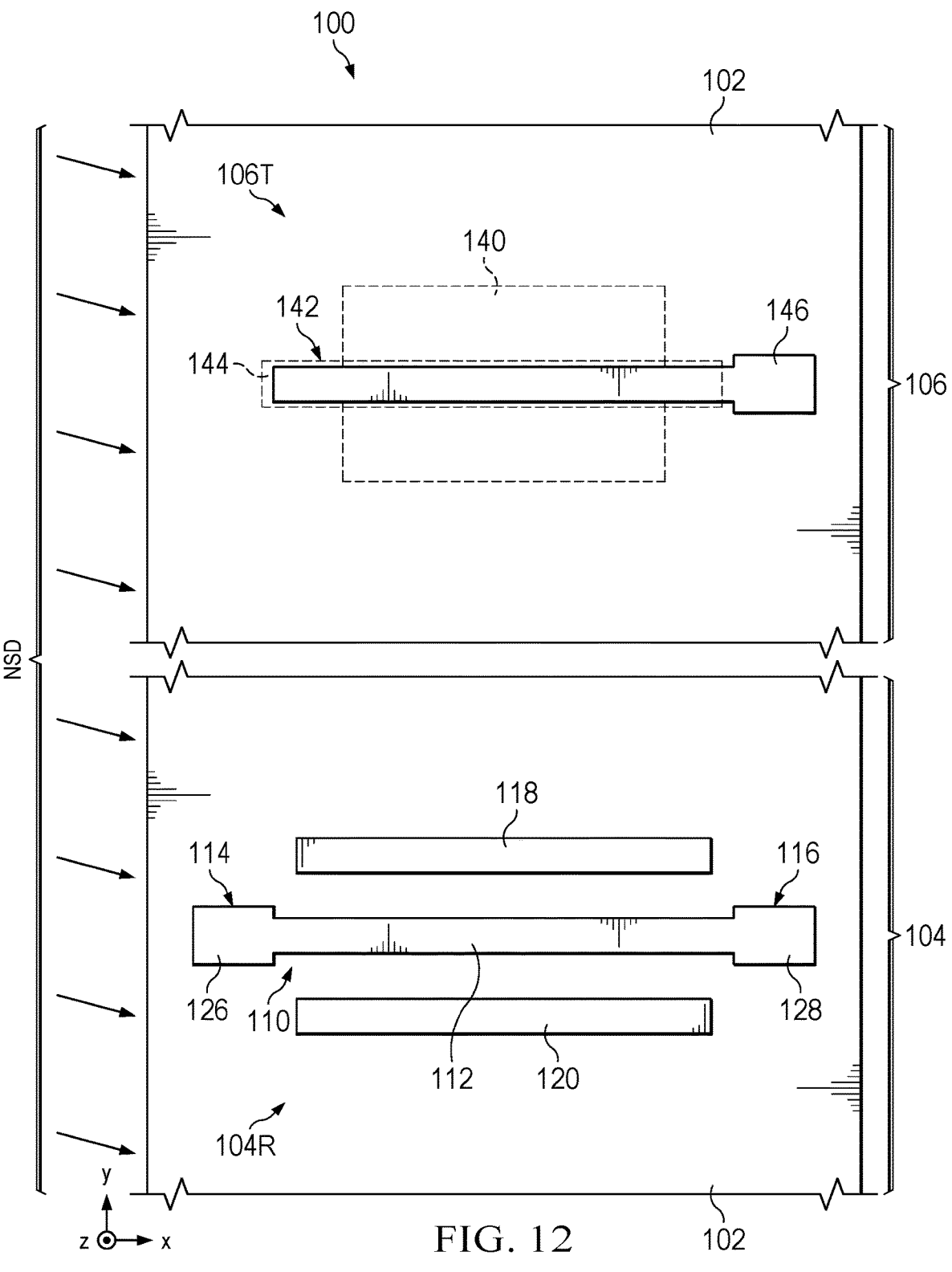
FIGS. 12 and 13 are plan views of the semiconductor device 100, as part of another alternative example for ultimately forming the resistor 104R and transistor 106T.

FIG. 12 is a plan view of the semiconductor device 100, as part of another alternative example for ultimately forming the resistor 104R and transistor 106T. In FIG. 12, the substrate 102 is again illustrated, along with polysilicon structures, including the polysilicon structure 110—including its polysilicon resistor body 112 and ends 114 and 116—and the polysilicon transistor gate 144. Also shown relative to the polysilicon structure 110 are the dummy polysilicon features 118 and 120. Once the illustrated polysilicon structures are formed, a first dopant implant step is performed, with a first dopant type and to correspond to a relatively high first dopant implant dose and energy-accordingly, either an NSD or PSD first dopant implant. The first dopant implant is to exposed surfaces, including at least the exposed surfaces of the substrate 102, the polysilicon transistor gate 144, and the polysilicon structure 110. While not shown, temporary (or disposable) spacers may be used, for example previously formed in contact with sidewalls of the transistor gate 144, so as to space the dopants into the moat 140 appropriately, and away from the transistor gate 144, and those temporary spacers are thereafter removed.

Figure 13:
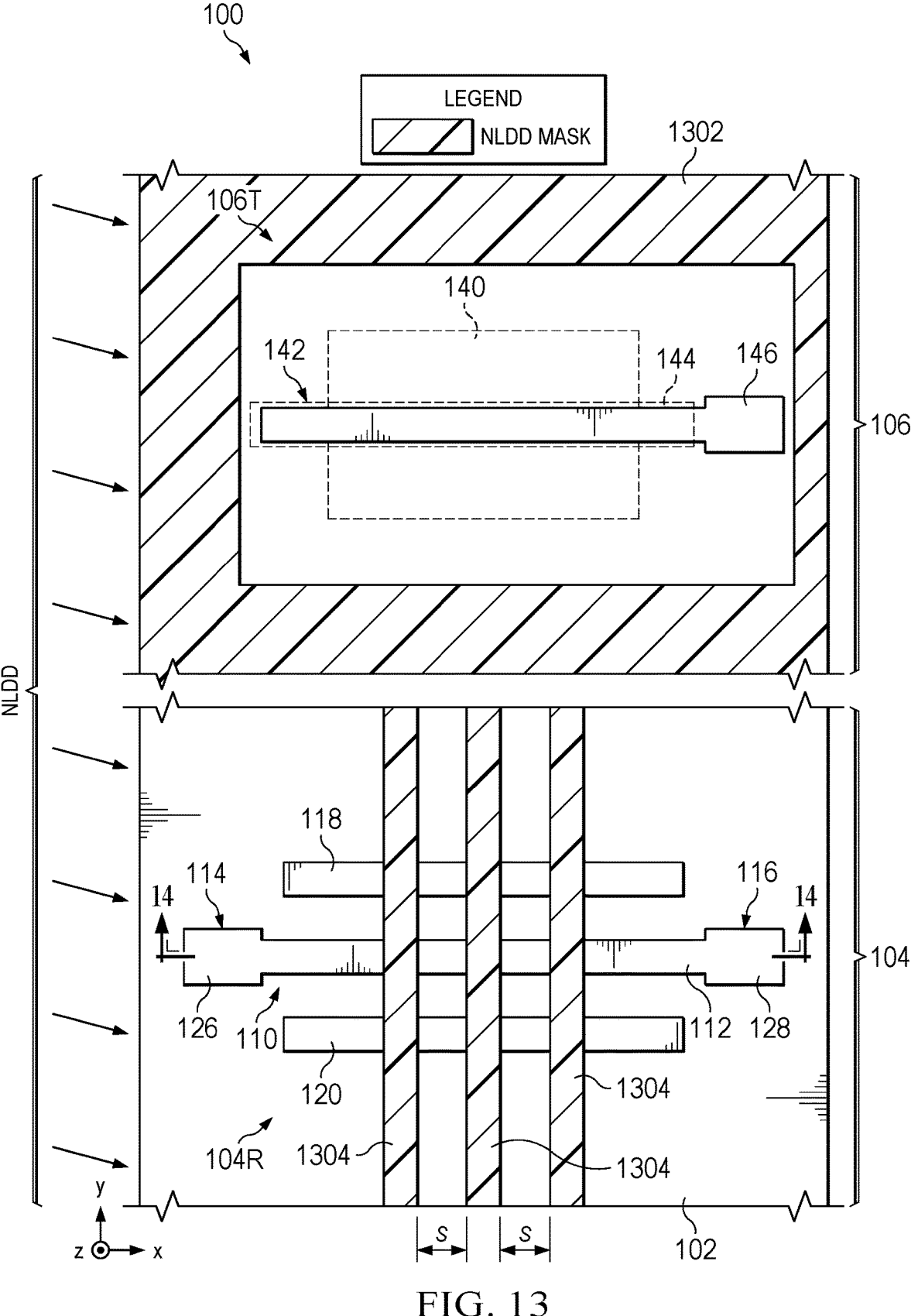

FIG. 13 is a plan view of the FIG. 12 semiconductor device 100, illustrating additional structure and a second implant step, following the FIG. 12 first dopant implant step. Prior to the FIG. 13 second implant, a single patterning forms an implant mask, but that mask is not only with respect to the transistor 106T, but also with respect to portions of the resistor 104R. Particularly, the mask blocks portions of the semiconductor device 100 from an upcoming implant, and in FIG. 13 this implant mask includes a transistor mask 1302 and a partial-resistor-body mask 1304. The transistor mask 1302 is formed to leave unexposed at least the moat 140, as is known in the prior art for source/drain and LDD implants. However, using the same mask formation step as the transistor mask 1302, the partial-resistor-body mask 1304 is formed over selected portions of the polysilicon resistor body 112 (and also may cover portions of the dummy polysilicon features 118 and 120). In the illustrated example, the partial-resistor-body mask 1304 is generally a striped pattern, comprising plural parallel portions, each with a respective major axis in the y-dimension and a spacing S from an adjacent portion. The spacing S may be selected based on considerations set forth below, and also may be defined (or constrained) based on applicable processes. After the partial-resistor-body mask 1304 is so formed, the FIG. 13 dopant implant step is performed. The FIG. 13 dopant implant is achieved again with the same FIG. 12 first dopant type (e.g., n-type if FIG. 12 was an n-type NSD, or p-type if FIG. 12 was a p-type PSD), but to correspond to a relatively low first dopant dose and energy—accordingly, either an NLDD or PLDD first dopant implant. As a result, the FIG. 13 dopant implant imparts dopants into all exposed polysilicon areas, including exposed portions of the substrate 102 such as the moat 140 and the unmasked portions of the polysilicon resistor body 112.

Figure 14:
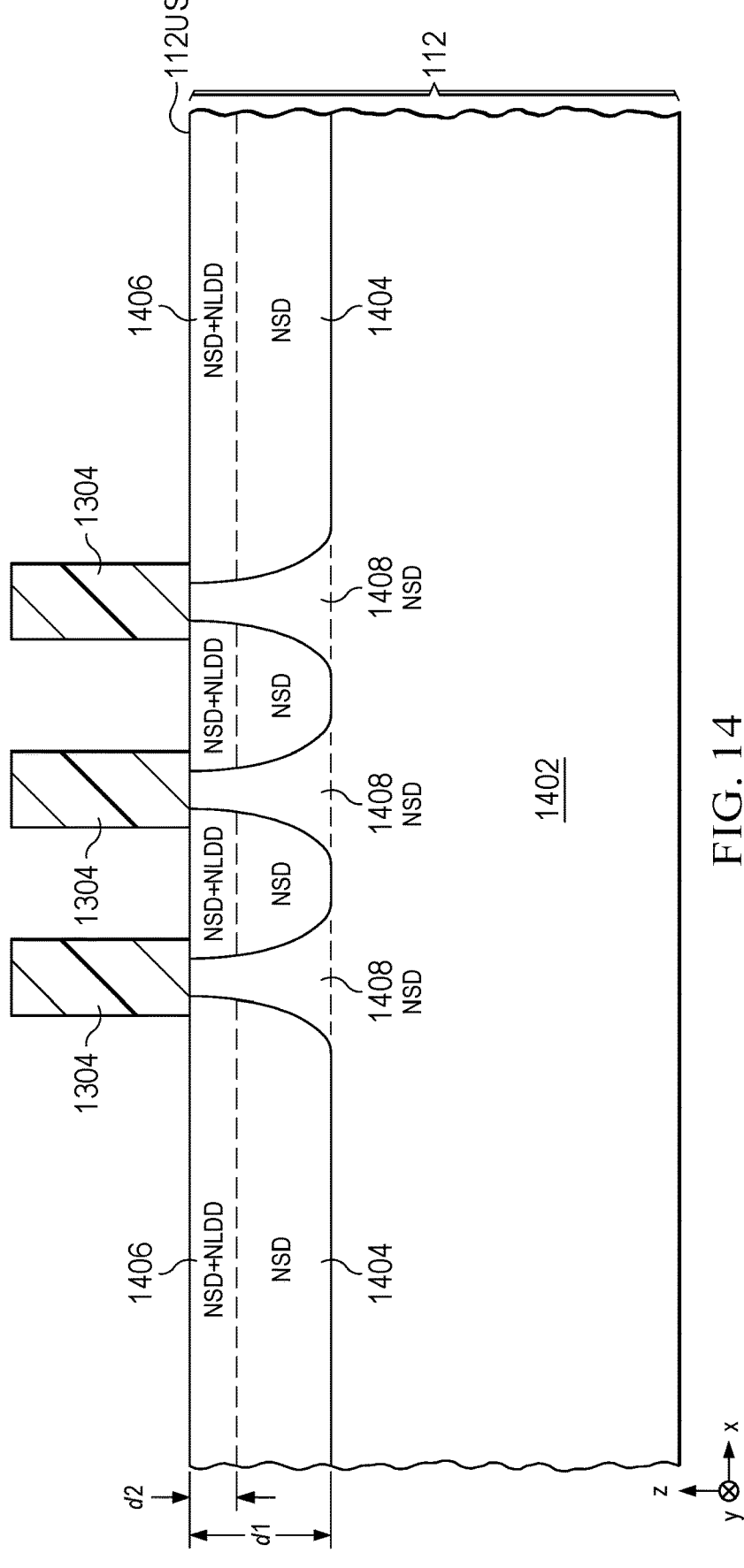
FIG. 14 illustrates a cross-sectional view, along the FIG. 13 x-dimension.

FIG. 14 illustrates a cross-sectional view, along the FIG. 13 x-dimension, of the polysilicon resistor body 112 following the FIG. 13 second dopant implant. The polysilicon resistor body 112 includes a deeper region 1402 into which the FIGS. 12 and 13 dopant implants do not reach. Further, the FIG. 12 first implant will impart a first dopant region 1404, at a depth d1 from the polysilicon upper surface 112US, and at a concentration, commensurate with the FIG. 12 first implant. The depth d1 may be in a range from 30 nm to 100 nm. In an example where the FIG. 12 first implant is n-type, then as shown in FIG. 14, the first dopant region 1404 is generally an NSD region. Still further, the FIG. 13 second implant will impart a second dopant region 1406, at depth d2, less than the depth d1 of the first dopant region 1404, and at a concentration, commensurate with the FIG. 13 second implant. The depth d2 may be in a range from 4 nm to 30 nm. Additionally, the dopants from the FIGS. 12 and 13 implants combine in the second dopant region 1406, and the dopants from the second implant may encroach somewhat laterally (in the x-dimension) under the lower corners of the partial-resistor-body mask 1304. And, the dopants in the depths of d1 and d2 may be further redistributed later, for example during a subsequent (e.g., source/drain) anneal. In an example where the FIGS. 12 and 13 first and second implants are n-type, then as shown in FIG. 14, the second dopant region 1406 is generally an NSD+NLDD region. Lastly, the masking provided by the partial-resistor-body mask 1304 masks the polysilicon upper surface 112US and thereby, in combination with the implants, creates a third dopant region 1408, which again is from the first (larger dose and energy) implant, where the resultant dopant extends the entire distance d1.

Given the preceding, the combination of two separate, same-type implants (e.g., FIGS. 12 and 13 respectively), and the partial-resistor-body mask 1304, creates a resistor 104R with a polysilicon body 112 having differing dopant concentrations at a depth d2 (or less) below its upper surface 112US. Accordingly, as should now be appreciated, the partial-resistor-body mask 1304 is shaped (including the FIG. 13 spacing S), and positioned, to selectively mask the polysilicon resistor body 112 so as to achieve this partial and variable body dopant implant. Further, the resultant variable body dopant implant can be targeted based on corresponding expected resistance and zero tempco attributes, so that, for example, if too much NLDD would detract from those attributes, the areas masked by the partial-resistor-body mask 1304 can be increased so there is an overall lesser presence of regions within the polysilicon resistor body 112 with a combined NSD+NLDD, and vice versa where a greater presence is desired of a combined NSD+NLDD. Opposite (or complementary) conductivity types are also contemplated, which would result in variations to FIG. 14 in which each of the first and third dopant region 1404 is generally a PSD region and the second dopant region 1406 is a PSD+PLDD region.

Figure 15:
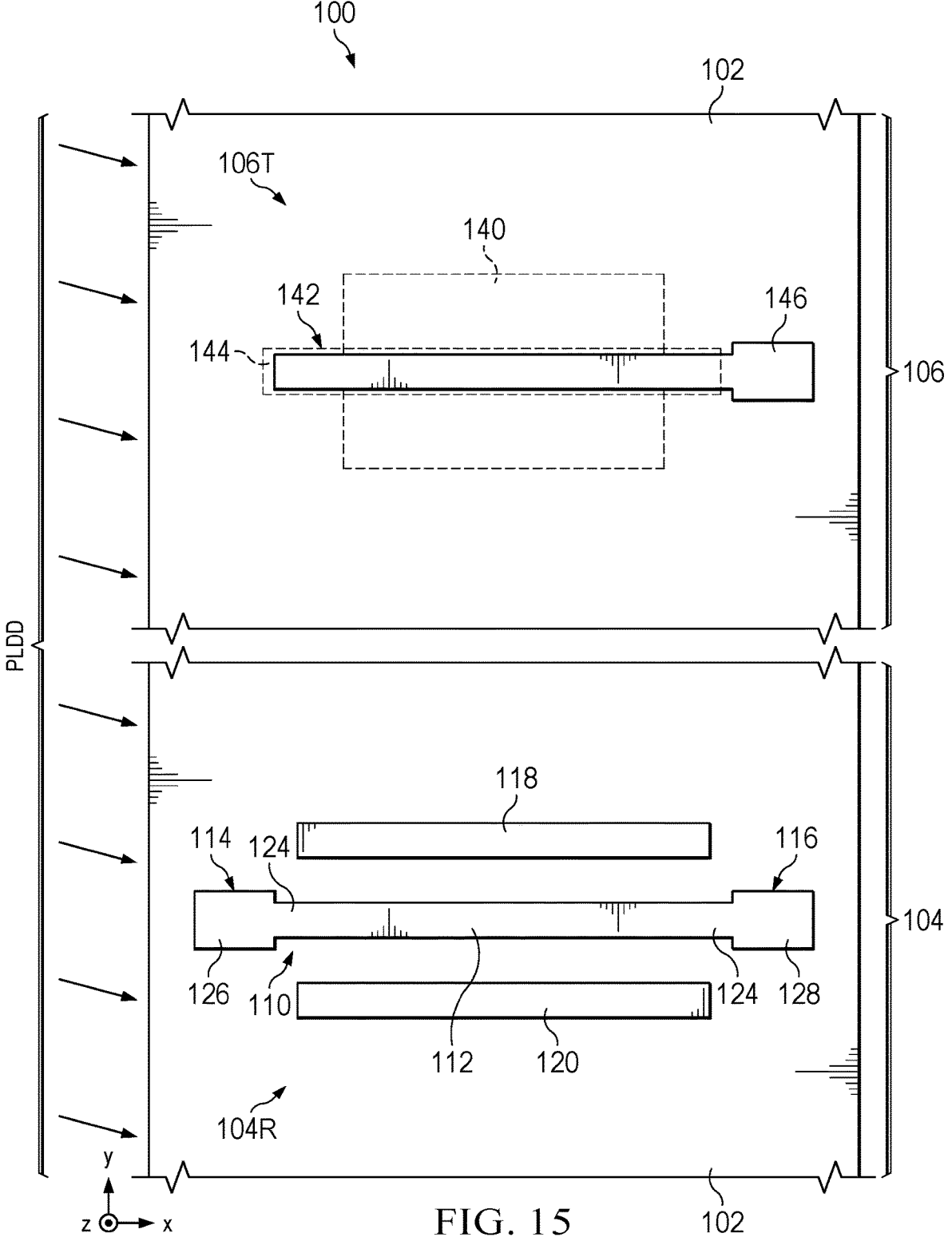
FIGS. 15 and 16 are plan views of the semiconductor device 100, as part of another alternative example for ultimately forming the resistor 104R and transistor 106T.
Figure 16:
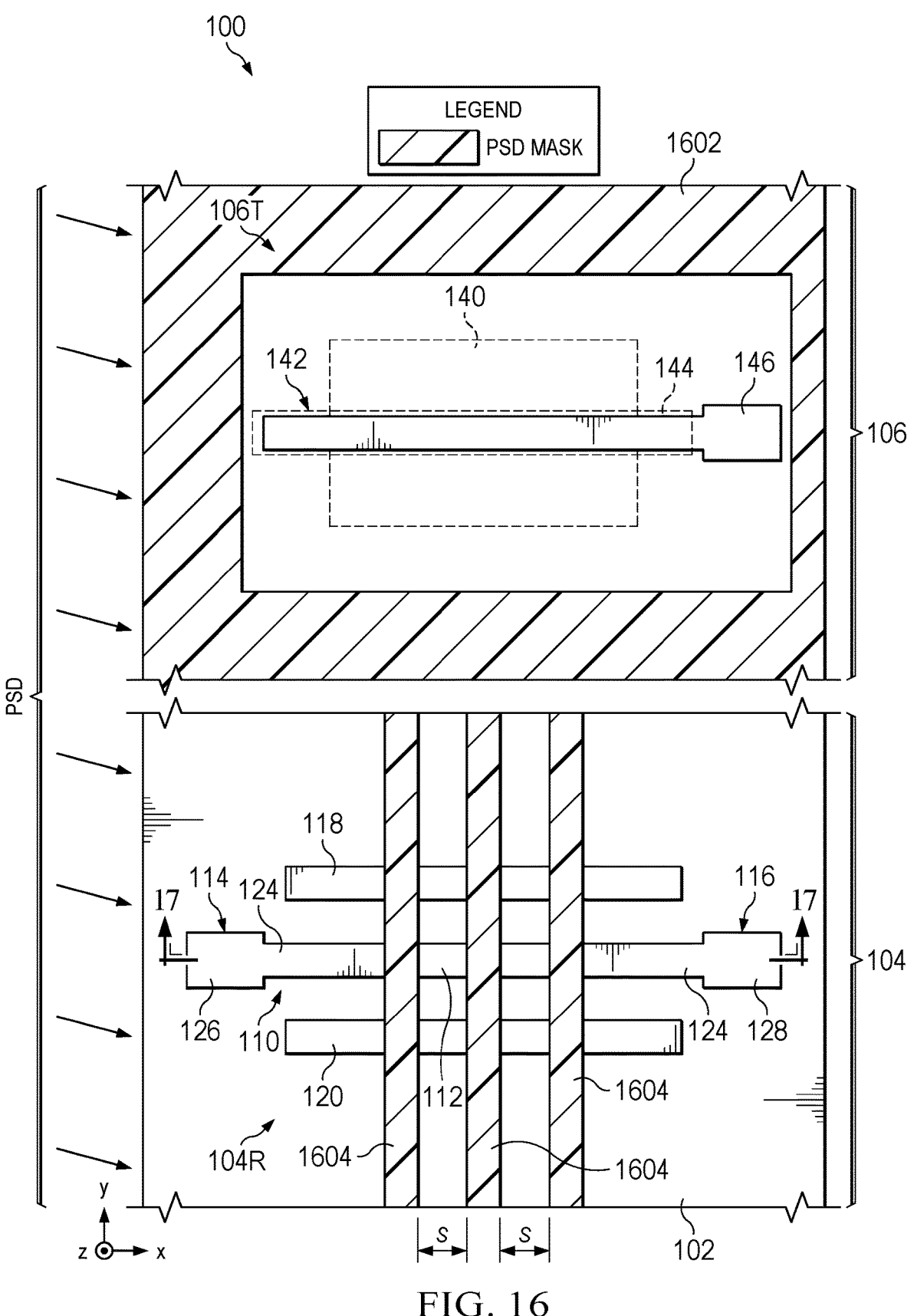

FIGS. 15 and 16 each illustrate a plan view of the semiconductor device 100, as part of another alternative example for ultimately forming the resistor 104R and transistor 106T. Further, FIGS. 15 and 16 are comparable to FIGS. 13 and 14, respectively, but with the order of dopant implant doses/energies being reversed. Accordingly, where FIGS. 13 and 14 illustrated a respective first relatively higher dose/energy dopant implant followed by a second, same type, relatively lighter dose/energy dopant implant, instead FIGS. 15 and 16 illustrate a respective first relatively lighter dose/energy dopant implant followed by a second, same type, relatively heavier dose/energy dopant implant.

In the sequence of FIGS. 15 and 16, first in FIG. 15 a first dopant implant step is achieved, with a first dopant type and to correspond to a relatively low first dopant dose/energy—accordingly, either an NLDD or PLDD first dopant implant. The first dopant implant is to exposed surfaces, including at least the exposed surfaces of the substrate 102 (including the moat 14), the polysilicon transistor gate 144, and the polysilicon structure 110. Next, in FIG. 16, a transistor mask 1602 and a partial-resistor-body mask 1604 are concurrently formed in respective resistor area 106 and transistor area 104, with the partial-resistor-body mask 1604 formed over selected portions of the polysilicon resistor body 112 (and also may cover portions of the dummy polysilicon features 118 and 120). In the FIG. 16 illustrated example, the partial-resistor-body mask 1604 is again a striped pattern, comprising plural parallel portions, each with a respective major axis in the y-dimension and a spacing S from an adjacent portion. A second dopant implant step is performed after the partial-resistor-body mask 1604 is formed. The second dopant implant a achieved again with the same FIG. 15 first dopant type (e.g., n-type if FIG. 15 was an n-type NLDD, or p-type if FIG. 15 was a p-type PLDD), but to correspond to a relatively high first dose/energy implant—accordingly, either an NSD or PSD second dopant implant. As a result, the second dopant implant imparts dopants into all exposed polysilicon areas, including the substrate 102, the moat 140, and the unmasked portions of the polysilicon structure 110.

Figure 17:
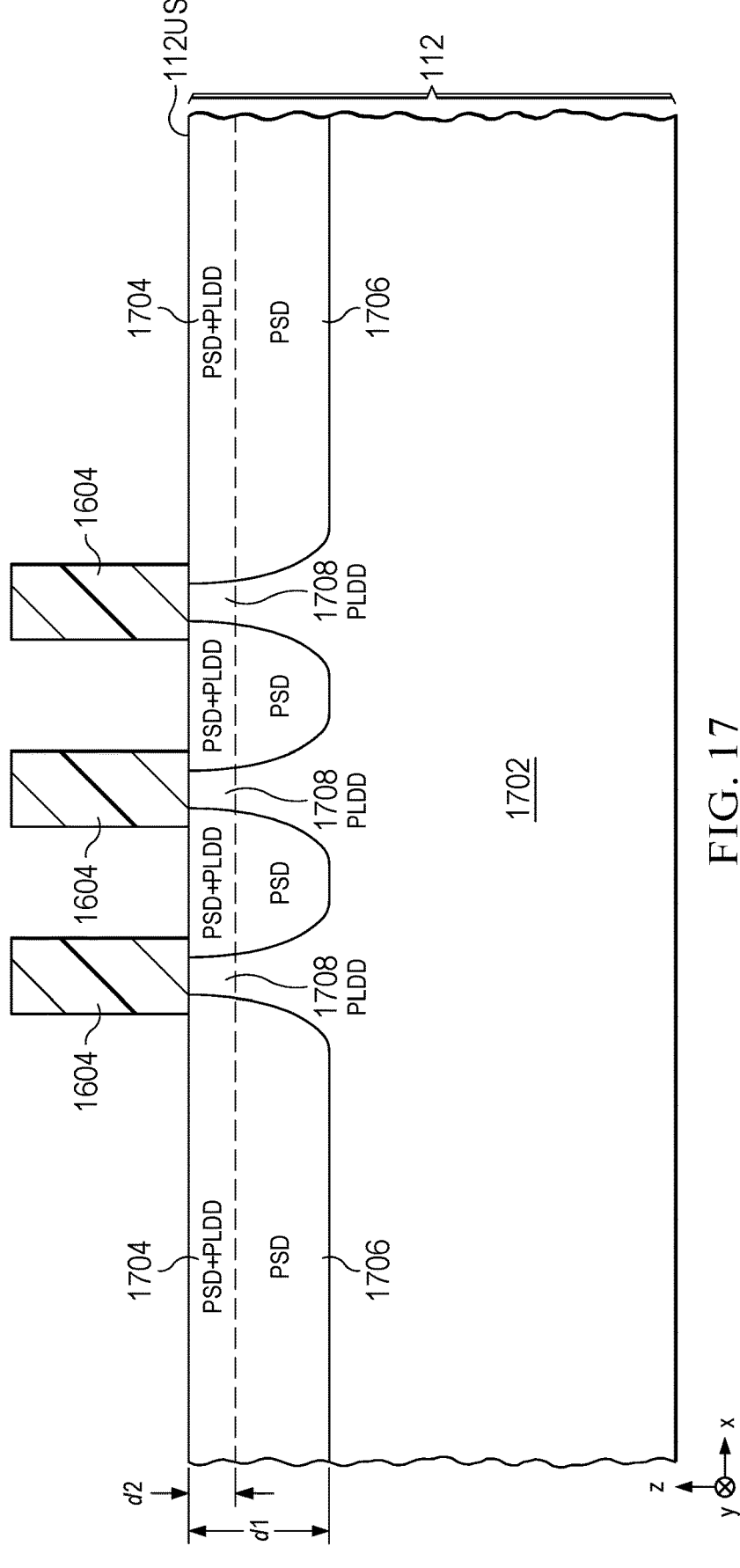
FIG. 17 illustrates a cross-sectional view, along the FIG. 16 x-dimension.

FIG. 17 illustrates a cross-sectional view, along the FIG. 16 x-dimension, of the polysilicon resistor body 112 following the FIG. 16 second dopant implant. The polysilicon resistor body 112 includes a deeper region 1702 into which the FIGS. 15 and 16 dopant implants do not reach. Further, the FIG. 15 first implant will impart a first dopant region 1704, at the depth d1 from the polysilicon upper surface 112US, and at a concentration, commensurate with the dose/energy of the FIG. 15 first implant, where d1 in FIG. 17 may be the same approximate depth as d1 in FIG. 14. In an example where the FIG. 15 first implant is p-type, then as shown in FIG. 17, but prior to the second implant, the first dopant region 1704 is generally a PLDD region that is approximately uniform in the x-dimension at common depths from the upper surface 112US. Still further, the FIG. 16 second implant will impart a second and higher dopant concentration. The FIG. 16 second dopant combines in the first dopant region 1704 with the PLDD already in that region from the first dopant implant, to form a PSD+PLDD concentration in the first dopant region 1704. Due to the energy of the FIG. 16 second dopant implant, however, in unmasked areas it also will extend beyond a distance d1, and to a larger distance d2, forming a region 1706 between d1 and d2, doped solely by the second dopant implant, where d2 in FIG. 17 may be the same approximate depth as d2 in FIG. 14. In an example where the FIGS. 15 and 16 first and second implants are p-type, then as shown in FIG. 17, the second dopant region 1706 is generally a PSD region. Lastly, the masking provided by the partial-resistor-body mask 1604 masks the polysilicon upper surface 112US and thereby, in combination with the implants, creates a third dopant region 1708, which again is from the first (lesser concentration) implant, where the resultant dopant extends the entire distance d1.

Figure 18:
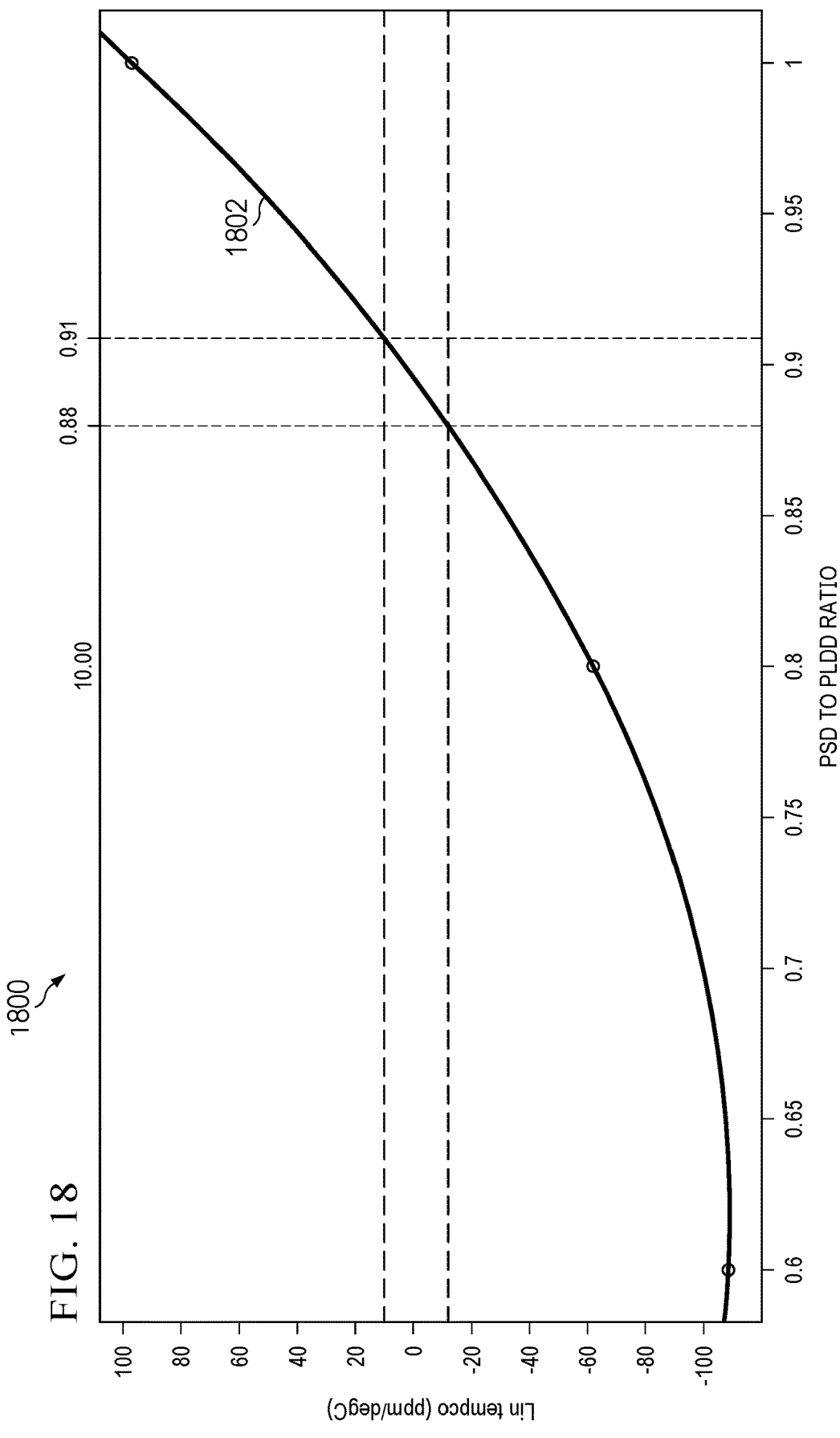
FIG. 18 is a resistance graph 1800 with a resistance plot 1802 for a resistor according to FIGS. 15-17.

FIG. 18 is a resistance graph 1800 with a resistance plot 1802 for a resistor according to FIGS. 15-17. The graph 1800 includes a PSD to PLDD ratio on its horizontal axis, which in the example illustrated is the ratio of PSD/PSD+ PLDD, and with that ratio providing a percentage of total resistor length which receives PSD. The plot 1802 demonstrates that a tempo from −10 ppm/° C. to +10 ppm/° C. may be achieved by applying a PSD to PLDD ratio from approximately 0.88 to 0.91. Accordingly, in an implementation in which ±10 ppm/° C. is considered zero tempco, the plot 1802 illustrates values, for example as applied to FIG. 17, in which 100% of a resistor surface receives a PLDD implant and approximately 90% of that 100% also receives a PSD implant. These and other values may be implemented using FIGS. 15-17 to achieve the desirable tempco, and without a separate two-step mask process, as may be implemented in other processes to achieve comparable zero tempo parameters. Further, with such variability, a first and second same-type dopant, for example directed to formation of the transistor 106T, also can be tuned, particularly in combination with a partial-resistor-body mask (e.g., 1604 or 1304), to get a desired resistance and tempco. This approach also may be used in selective IC locations, for example as applied to context dependencies, thereby reducing potential undesirable effects (e.g., drift, resistance mismatch) and potentially avoiding failures that could otherwise occur.

From the above, one skilled in the art should appreciate that examples are provided for semiconductor IC fabrication, for example with respect to an IC that includes both polysilicon resistors and other active devices, such as transistors, diodes, diffusion resistors in silicon, and MOS capacitors. Such examples provide various benefits, some of which are described above and including still others. Some examples are formed using a co-implant to both a resistor and other active device (e.g., transistor) feature. Other examples, with or without a co-implant, use plural doping steps, already in a process flow for a different IC active device, also to dope all or portions of a resistor body. Examples have been provided where the plural doping steps include a transistor LDD and source/drain implant, but others are contemplated. Such examples may improve performance relative to other ZTCR approaches, while reducing or eliminating the need for separate, and earlier in the process, ZTCR masking and implanting steps. These benefits may be realized for more complex structures, of for multiple devices on the same substrate (and IC), thereby realizing scaled improvement across the device. Still additional modifications are possible in the described examples, and other examples are possible, within the scope of the following claims.

What is claimed is:

1. A method of forming an integrated circuit, comprising:
from a semiconductor layer having a first surface, forming a resistor body having first and second ends and a resistor surface as a portion of the first surface and an active device feature having an active device feature surface as a portion of the first surface;
forming an implant mask over the resistor body, the implant mask including periodic mask portions spaced apart between the first and second ends;
concurrently implanting a dopant into the resistor surface and the active device feature surface;
concurrently co-implanting a non-dopant into the resistor surface and the active device feature surface;
siliciding a portion of the resistor surface; and
siliciding an entirety of the active device feature surface.

2. The method of claim 1 wherein the active device feature comprises a transistor gate.

3. The method of claim 1 wherein the step of concurrently implanting a dopant and the step of concurrently co-implanting a non-dopant occur at a same time.

4. The method of claim 1 wherein the step of siliciding a portion of the resistor surface comprises siliciding a range from 0.2 percent to 70 percent of the resistor surface.

5. The method of claim 1 wherein the step of siliciding a portion of the resistor surface and the step of siliciding an entirety of the active device feature surface occur at a same time.

6. The method of claim 1 wherein the non-dopant comprises carbon.

7. The method of claim 1 wherein the non-dopant comprises nitrogen.

8. The method of claim 1 wherein the non-dopant comprises carbon and nitrogen.

9. The method of claim 1 wherein the portion of the resistor surface is less than an entirety of the resistor surface.

10. The method of claim 1 wherein the non-dopant is implanted with a dose of about 1e15 atoms/cm$^2$.

11. The method of claim 1 wherein a resistor including the resistor body, the dopant, and the non-dopant has a temperature coefficient of resistance of about ±100 ppm/° C. for a resistor body width of about 0.2 µm or greater.

12. The method of claim 1 wherein the semiconductor layer comprises polysilicon.

13. An integrated circuit, comprising:
a semiconductor layer having a first surface, the first surface including a resistor body and an active device feature, each of the resistor body and the active device feature including both a dopant and a non-dopant co-implant species;

first portions of the resistor body alternating with second portions of the resistor body, the first portions having a first dopant concentration and the second portions having a different second dopant concentration;

a resistor silicide along a portion of a top surface of the resistor; and a device silicide along an entirety of a top surface of the active device feature.

14. The integrated circuit of claim 13 wherein the active device feature comprises a transistor gate.

15. The integrated circuit of claim 13 wherein a percentage of the top surface of the resistor covered by the resistor silicide ranges from 0.2 percent to 70 percent of the resistor surface.

16. The integrated circuit of claim 13 wherein the non-dopant comprises carbon.

17. The integrated circuit of claim 13 wherein the non-dopant comprises nitrogen.

18. The integrated circuit of claim 13 wherein a resistor including the resistor body, the dopant, and the non-dopant has a temperature coefficient of resistance of about ±100 ppm/° C. for a resistor body width of about 0.2 μm or greater.

19. The integrated circuit of claim 13 wherein the semiconductor layer comprises polysilicon.

\* \* \* \* \*